United States Patent
Nakajima

(10) Patent No.: US 10,877,375 B2
(45) Date of Patent: Dec. 29, 2020

(54) REFLECTION TYPE EXPOSURE MASK AND PATTERN FORMING METHOD

(71) Applicant: TOSHIBA MEMORY CORPORATION, Tokyo (JP)

(72) Inventor: Yumi Nakajima, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 212 days.

(21) Appl. No.: 15/907,096

(22) Filed: Feb. 27, 2018

(65) Prior Publication Data

US 2019/0079387 A1 Mar. 14, 2019

(30) Foreign Application Priority Data

Sep. 13, 2017 (JP) .................. 2017-176150

(51) Int. Cl.
 *G03F 7/16* (2006.01)
 *G03F 1/58* (2012.01)
 *G03F 1/52* (2012.01)
 *G03F 1/24* (2012.01)
 *G03F 7/20* (2006.01)
 *H01L 21/311* (2006.01)

(52) U.S. Cl.
 CPC ................ *G03F 7/161* (2013.01); *G03F 1/24* (2013.01); *G03F 1/52* (2013.01); *G03F 1/58* (2013.01); *G03F 7/201* (2013.01); *G03F 7/16* (2013.01); *G03F 7/70283* (2013.01); *H01L 21/31144* (2013.01)

(58) Field of Classification Search
 CPC . G03F 7/161; G03F 7/16; G03F 7/201; G03F 7/70283; G03F 1/58; G03F 1/24; G03F 1/52; H01L 21/31144
 See application file for complete search history.

(56) References Cited

U.S. PATENT DOCUMENTS

| | | | |
|---|---|---|---|
| 7,094,507 B2 | 8/2006 | Hirscher et al. | |
| 7,642,017 B2 | 1/2010 | Huh et al. | |
| 9,535,332 B2 | 1/2017 | Ruoff et al. | |
| 2006/0134531 A1* | 6/2006 | Song | G03F 1/24 430/5 |
| 2010/0304279 A1 | 12/2010 | Mimotogi et al. | |

* cited by examiner

*Primary Examiner* — Daborah Chacko-Davis
(74) *Attorney, Agent, or Firm* — Foley & Lardner LLP

(57) ABSTRACT

A reflection type exposure mask includes a substrate, a reflective layer provided on the substrate, and a light absorption layer provided on the surface of the reflective layer. The light absorption layer includes a first absorber and a second absorber. The first absorber extends in a first direction along the surface of the reflective layer. The second absorber extends in a second direction along the surface of the reflective layer, which intersects with the first direction. The thickness of the second absorber in a third direction which is perpendicular to the surface of the reflective layer is thinner than the thickness of the first absorber in the third direction.

10 Claims, 12 Drawing Sheets

NEGATIVE SIDE ←—— $BF_M$ |←$H_S$→| $BF_P$ ——→ POSITIVE SIDE

Focus Position

REFLECTION TYPE EXPOSURE MASK AND PATTERN FORMING METHOD

CROSS-REFERENCE TO RELATED APPLICATION

This application claims the benefit of and priority to Japanese Patent Application No. 2017-176150, filed Sep. 13, 2017, the entire contents of which are incorporated herein by reference.

FIELD

Embodiments described herein relate generally to a reflection type exposure mask and a pattern forming method.

BACKGROUND

EUV exposure using extreme ultraviolet (EUV) light attracts attention with high density integration of a semiconductor memory device. In EUV exposure, an image of a highly fine pattern can be formed on a photosensitive film provided on a wafer. However, in a case where the EUV exposure is used in manufacturing procedures of, for example, a storage device including memory cells which are three-dimensionally arranged, a technology of allowing uniform focusing on a photosensitive film having a large step is required.

DETAILED DESCRIPTION

Figure 1:
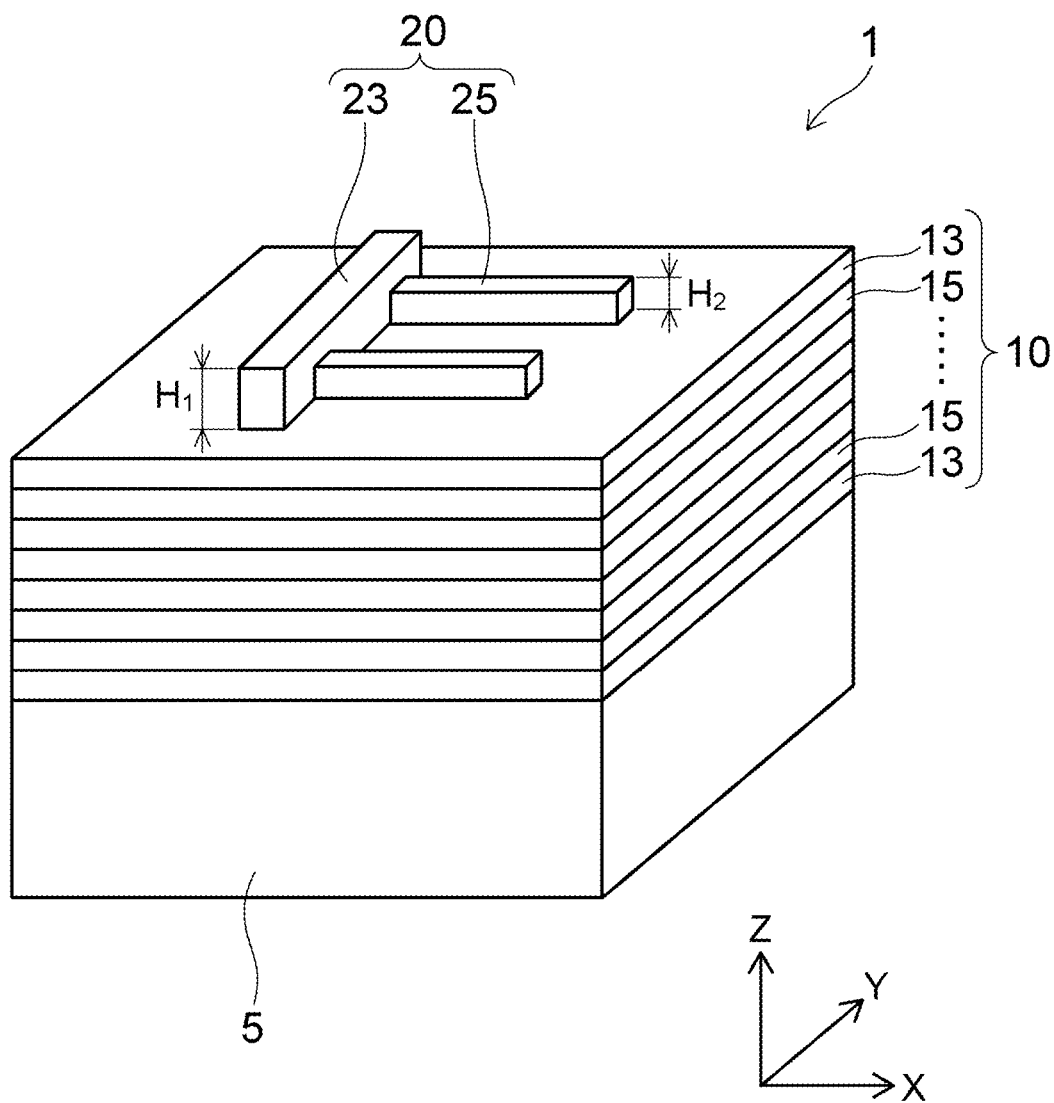
FIG. 1 is a perspective view schematically illustrating a reflection type exposure mask according to some embodiments.

Exemplary embodiments provide a reflection type exposure mask which allows the entirety of a mask pattern to be exposed at the best focus position, and a pattern forming method using the reflection type exposure mask.

In general, according to some embodiments, a reflection type exposure mask includes a substrate, a reflective layer provided on the substrate, and a light absorption layer provided on a surface of the reflective layer. The light absorption layer includes a first absorber and a second absorber. The first absorber extends in a first direction along the surface of the reflective layer. The second absorber extends in a second direction along the surface of the reflective layer, which intersects with the first direction. The thickness of the second absorber in a third direction, which is perpendicular to the surface of the reflective layer, is thinner than the thickness of the first absorber in the third direction.

According to some embodiments, a pattern forming method includes forming a photosensitive film on a substrate, such as a wafer, forming an image of a predetermined pattern on the photosensitive film by condensing reflected light of exposure light with which the reflection type exposure mask is irradiated, and transferring the pattern to the photosensitive film. The substrate, such as a wafer, includes a first region and a second region which are adjacent to each other with a step which is formed on the surface of the photosensitive film and is interposed between the first region and the second region. The reflection type exposure mask includes a reflective layer that reflects the exposure light and a light absorption layer which is provided on the surface of the reflective layer and absorbs the exposure light. The light absorption layer includes a first light absorption portion and a second light absorption portion. The first light absorption portion extends in the first direction along the surface of the reflective layer and forms a first image in the first region. The second light absorption portion extends in a first direction and forms a second image in the second region. The thickness of the first light absorption portion in a direction, which is perpendicular to the surface of the reflective layer, is thinner than the thickness of the second light absorption portion in the direction which is perpendicular to the surface of the reflective layer.

Hereinafter, some embodiments are described with reference to the drawings. The same parts in the drawings are denoted by the same reference signs, and detailed descriptions thereof will not be repeated. Different parts will be described. The drawings may be schematic or conceptual. Thus, a relationship between the thickness and the width of each part, a ratio of the size between parts, and the like are not necessarily limited to being equal to those of parts in practice. Even in a case where the same part is illustrated, the part may be illustrated with different dimensions or a different ratio in the drawings.

Disposition and a configuration of parts will be described by using an X-axis, a Y-axis, and a Z-axis illustrated in the drawings. The X-axis, the Y-axis, and the Z-axis are mutually orthogonal to each other, and respectively indicate an X-direction, a Y-direction, and a Z-direction. Descriptions may be made on the assumption that the Z-direction is an upward direction and the opposite direction of the Z-direction is a downward direction.

FIG. 1 is a perspective view schematically illustrating a reflection type exposure mask 1 according to some embodiments. As illustrated in FIG. 1, the reflection type exposure mask 1 includes a substrate 5, a reflective layer 10, and a light absorption layer 20.

The substrate 5 may be, for example, a glass substrate. The reflective layer 10 may have a stacked structure in which a plurality of films are stacked on the substrate 5. For example, the reflective layer 10 may include a plurality of silicon films 13 and a plurality of molybdenum films 15. The silicon films 13 and the molybdenum films 15 may be alternately stacked in the Z-direction.

The light absorption layer 20 is provided over the reflective layer 10. The light absorption layer 20 may be formed, for example, by tantalum oxide (TaO) as a material. The light absorption layer 20 includes an absorber 23 and an absorber 25. The absorber 23 extends in the Y-direction along the surface of the reflective layer 10. The absorber 25 extends in the X-direction along the surface of the reflective layer 10. The thickness $H_1$ of the absorber 23 which extends in the Z-direction is thicker than the thickness $H_2$ of the absorber 25 which extends in the Z-direction.

Figure 2A:
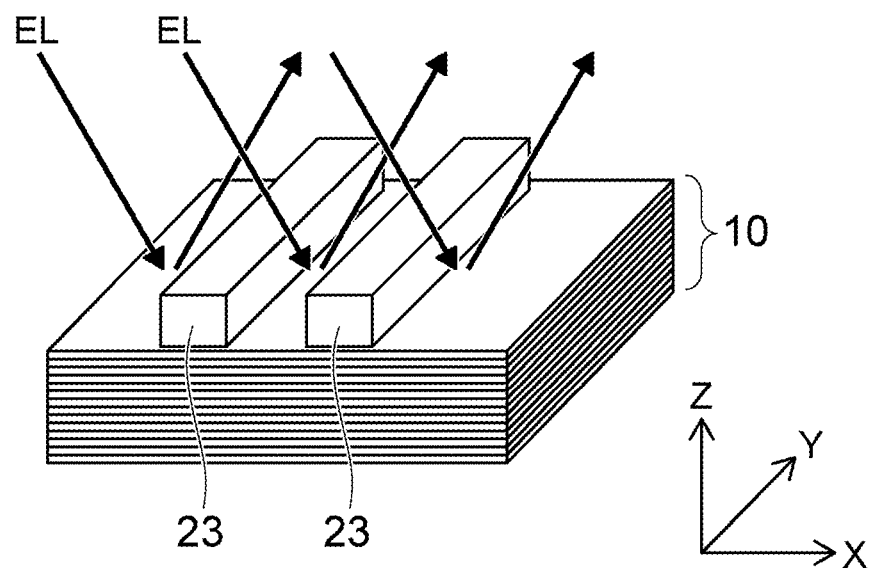
FIGS. 2A and 2B are perspective views schematically illustrating an incident direction of exposure light to the reflection type exposure mask according to some embodiments.
Figure 2B:
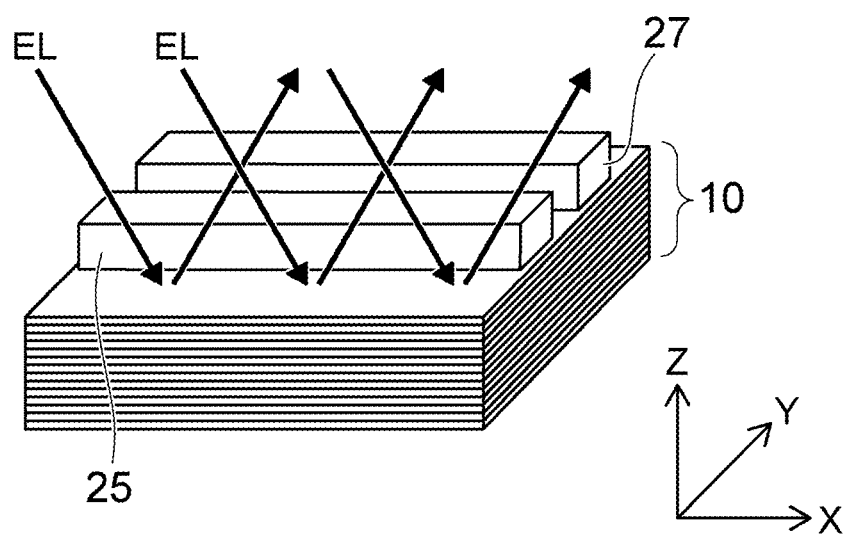

FIGS. 2A and 2B are perspective views schematically illustrating an incident direction of exposure light EL in the reflection type exposure mask according to the embodiment. In EUV exposure, a surface (first surface as shown in FIG. 1) of the reflection type exposure mask, on which the light absorption layer 20 is provided is irradiated with EUV light, and reflected light is condensed on the surface of a wafer, on which a photosensitive film is formed. The light absorption layer 20 absorbs EUV light and causes an image of a mask pattern corresponding to the shape of the light absorption layer 20, when viewed from the upper part of the first surface, to be formed on the photosensitive film.

As illustrated in FIGS. 2A and 2B, irradiation with the exposure light EL is performed from an upper part which is inclined relative to the reflection type exposure mask. The exposure light EL is parallel light. The surface of the reflection type exposure mask may be irradiated with the exposure light EL having an incident angle in a range of 5 degrees to 10 degrees, for example. In this example, the exposure light EL propagates in a direction along an X-Z plane.

As illustrated in FIG. 2A, when viewed from the upper part, the exposure light EL is incident in a direction which is orthogonal to the absorber 23 which extends in the Y-direction. As illustrated in FIG. 2B, when viewed from the upper part, the exposure light EL is incident in a direction which is parallel to the absorber 27 which extends in the X-direction. That is, the exposure light EL is incident in the X-direction in FIGS. 2A and 2B.

Figure 3A:
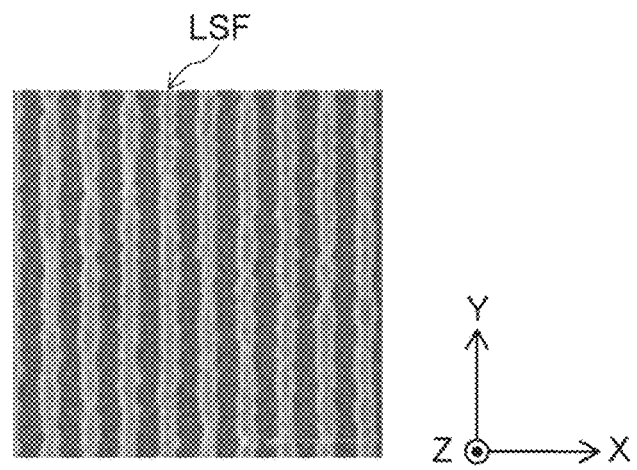
FIGS. 3A to 3C illustrate scanning electron microscope (SEM) images illustrating a pattern transferred to a photosensitive film by using a reflection type exposure mask according to some embodiments.
Figure 3B:
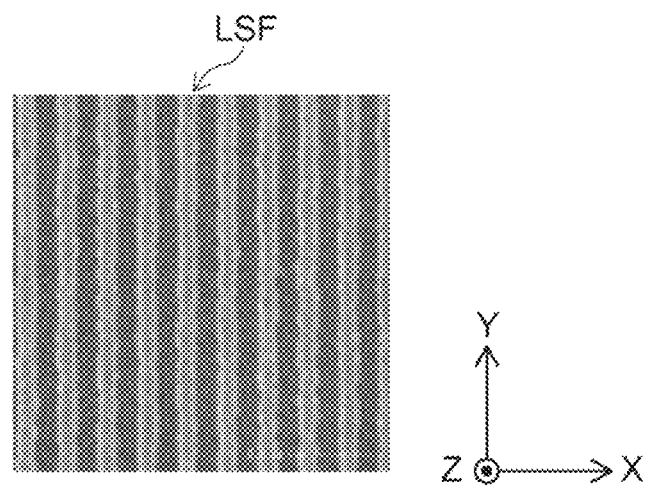

FIGS. 3A to 3B illustrate SEM images of a photosensitive film LSF. A line-and-space pattern derived from a plurality of absorbers 23 is transferred to the photosensitive film LSF by using EUV exposure. The plurality of absorbers 23 are provided on the reflective layer 10 of the reflection type exposure mask.

Figure 3C:
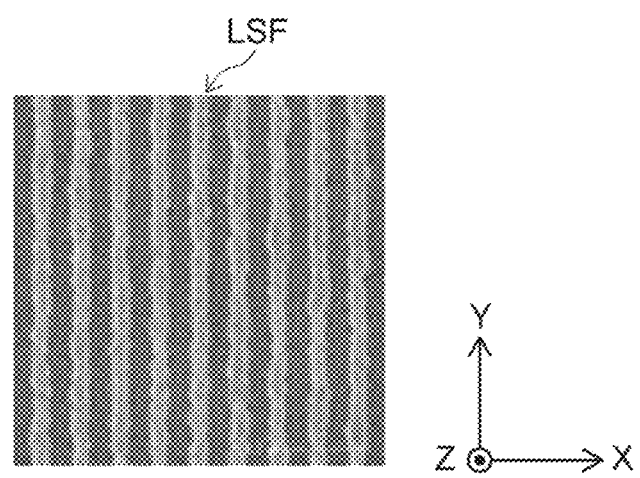

In EUV exposure corresponding to FIGS. 3A to 3C, the reflection type exposure mask is irradiated with exposure light EL in a direction which is orthogonal to the absorbers 23 when viewed from the upper part of the first surface. Then, exposure is performed such that focus positions of exposure light EL which is reflected by the reflection type exposure mask, on the photosensitive film LSF, are different from each other. Here, the focus position means a relative level in a direction which is perpendicular to the surface of a wafer. For example, in this application, the focus position refers to a distance from the wafer. For example, a phase of the focus position being on a negative side means a position being close to the surface of a wafer, and a phase of the focus position being on a positive side means a position being far from the surface of a wafer.

For example, in the example illustrated in FIG. 3B, the line width in the photosensitive film LSF varies a little and the average line width in the X-direction is the widest, in comparison to those in FIGS. 3A and 3C. For example, if a focus position transferred so as to obtain the widest average line width in the photosensitive film LSF is set to be the best focus position, an image is formed at a focus position on a negative side of the best focus position, in the example illustrated in FIG. 3A. In the example illustrated in FIG. 3C, an image is formed at a focus position on a positive side of the best focus position.

Figure 4:
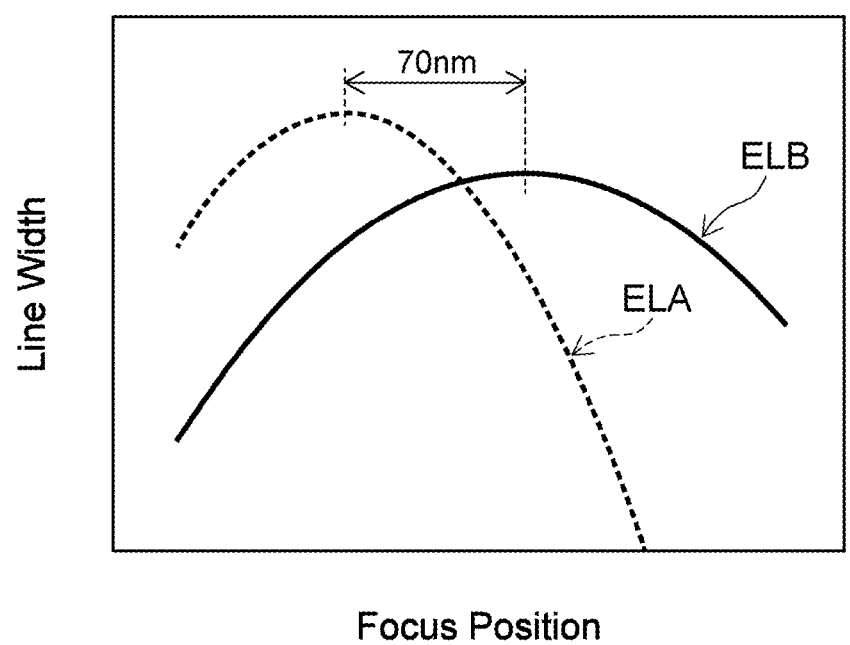
FIG. 4 is a graph illustrating a first characteristic of a reflection type exposure mask according to some embodiments.

FIG. 4 is a graph illustrating a change in the average line width in the photosensitive film LSF, in accordance with the focus position. A graph ELA in FIG. 4 indicates a characteristic in a case where irradiation with exposure light EL is performed in a direction which is orthogonal to an extension direction of the absorber 23 (see FIG. 2A). A graph ELB in FIG. 4 indicates a characteristic in a case where irradiation with exposure light EL is performed in parallel to an extension direction of the absorber 25 (see FIG. 2B). It is assumed that the thickness of the absorber 23 is equal to the thickness of the absorber 25.

As illustrated in FIG. 4, the best focus position at which the average line width is the maximum in the graph ELA is different from the best focus position at which the average line width is the maximum in the graph ELB. That is, if the extension directions of the absorbers with respect to the incident direction of exposure light EL are different from each other, the best focus positions of the absorbers have levels different from each other. For example, a difference in the level between the best focus position, which is illustrated in FIG. 4 is about 70 nanometers (nm). It is considered that such a difference occurs by shadowing of exposure light EL, which is caused by the thickness of the absorber 23. Such a difference means that it is not possible to form an image of the mask pattern of the light absorption layer 20 which includes a plurality of absorbers which respectively extend in different directions, in a condition in which the common level serves as the best focus position.

In other words, in a case where a plurality of absorbers which respectively extend in different directions are provided on the reflective layer 10, there is no level which serves as the best focus position for all of the absorbers. Thus, in the reflection type exposure mask 1 according to the embodiment, the absorber 23 and the absorber 25 are provided to cause the thickness $H_1$ of the absorber 23 which extends in the Y-direction to be different from the thickness $H_2$ of the absorber 25 which extends in the X-direction. That is, the absorbers are formed in advance so as to cause the thickness of a plurality of absorbers which respectively extend in different directions (that is, shadowing levels derived from the absorbers) to be different from each other. Thus, a difference between the best focus position for the absorber 23 and the best focus position for the absorber 25 can be canceled and the entirety of the mask pattern can be transferred to the photosensitive film LSF at the best focus position. That is, an image of the entirety of the mask pattern which includes the absorbers 23 and 25 can be formed at the best focus position.

Figure 5A:
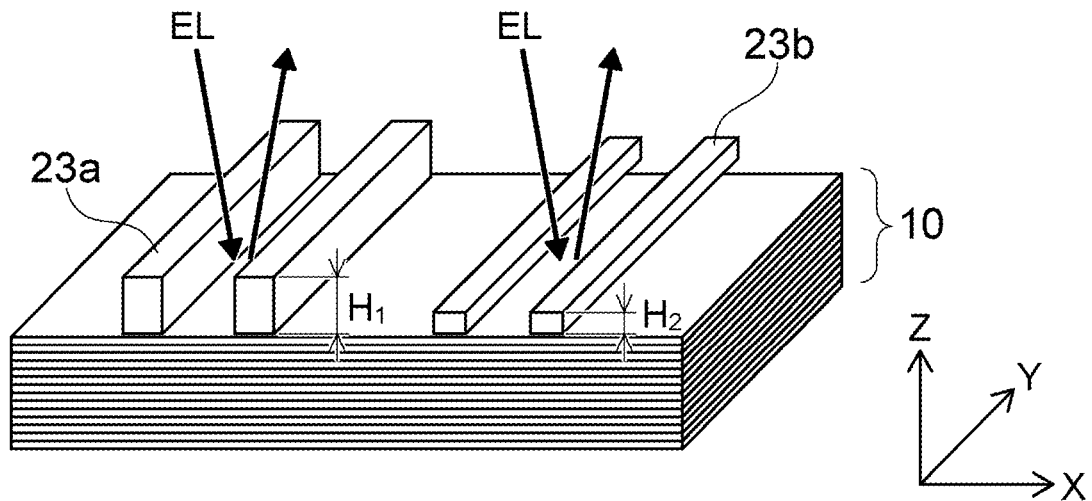
FIGS. 5A and 5B are graphs illustrating a second characteristic of a reflection type exposure mask according to some embodiments.
Figure 5B:
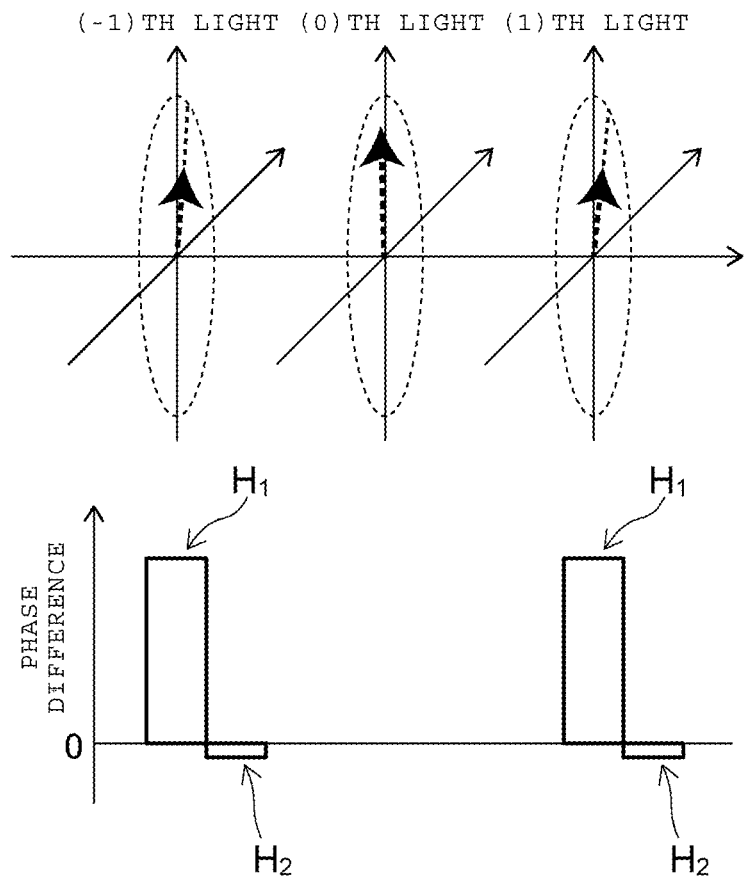

FIGS. 5A and 5B are schematic diagrams illustrating a change of reflected light in a case where the thickness of the absorber 23 which extends in the Y-direction varies. FIG. 5A is a perspective view schematically illustrating a structure of the reflection type exposure mask. FIG. 5B is a schematic diagram illustrating a characteristic of the reflected light.

As illustrated in FIG. 5A, an absorber 23a and an absorber 23b which extend in the Y-direction are provided on the reflective layer 10. The absorber 23a has a thickness $H_1$ in the Z-direction, and the absorber 23b has a thickness $H_2$ in the Z-direction. The absorber 23a is provided to be thinner than the absorber 23b ($H_2<H_1$).

FIG. 5B illustrates a characteristic of exposure light EL reflected by a region in which the absorber 23a is provided, and a region in which the absorber 23b is provided. As illustrated in FIG. 5B, the reflected exposure light EL includes (0)th light, (−1)th light, and (1)th light. In comparison to a phase difference between the (−1)th light or the (1)th light, and the (0)th light of the exposure light EL, a phase difference for exposure light EL reflected by the region in which the absorber 23a having a thickness $H_1$ is provided is greater than a phase difference for exposure light EL reflected by the region in which the absorber 23b having a thickness $H_2$ is provided.

Figure 6:
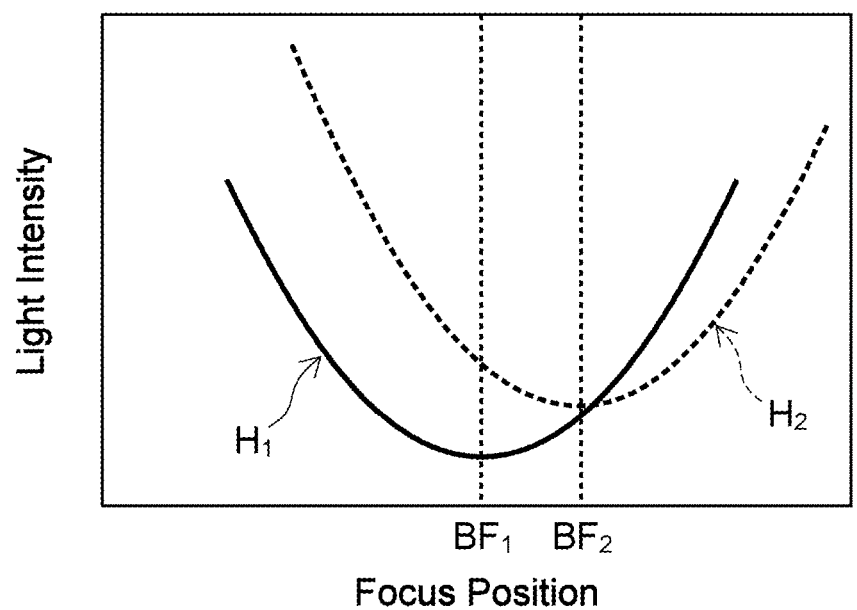
FIG. 6 is a graph illustrating a third characteristic of a reflection type exposure mask according to some embodiments.

FIG. 6 is a graph illustrating light intensity at a portion of the pattern of which an image is formed on the photosensitive film, in accordance with the focus position. The portion of the pattern corresponds to each of the absorbers 23a and 23b. A horizontal axis indicates a focus position, and a vertical axis indicates light intensity. The horizontal axis indicates a position as far from the wafer as is shifted toward the positive side (rightward in FIG. 6).

In FIG. 6, a focus position at which the light intensity is the minimum means the best focus position. Such a change in the light intensity occurs because the position (best focus position) of the pattern of which the image is formed by two-beam interference changes depending on a phase difference between the (0)th light, and the (−1)th light or the (1)th light.

As illustrated in FIG. 6, the best focus position $BF_1$ of exposure light EL reflected at a portion at which the absorber 23a having a thickness $H_1$ is provided is located on the negative side of the best focus position BF2 of exposure light EL reflected at a portion at which the absorber 23b having a thickness $H_2$ is provided.

Figure 7:
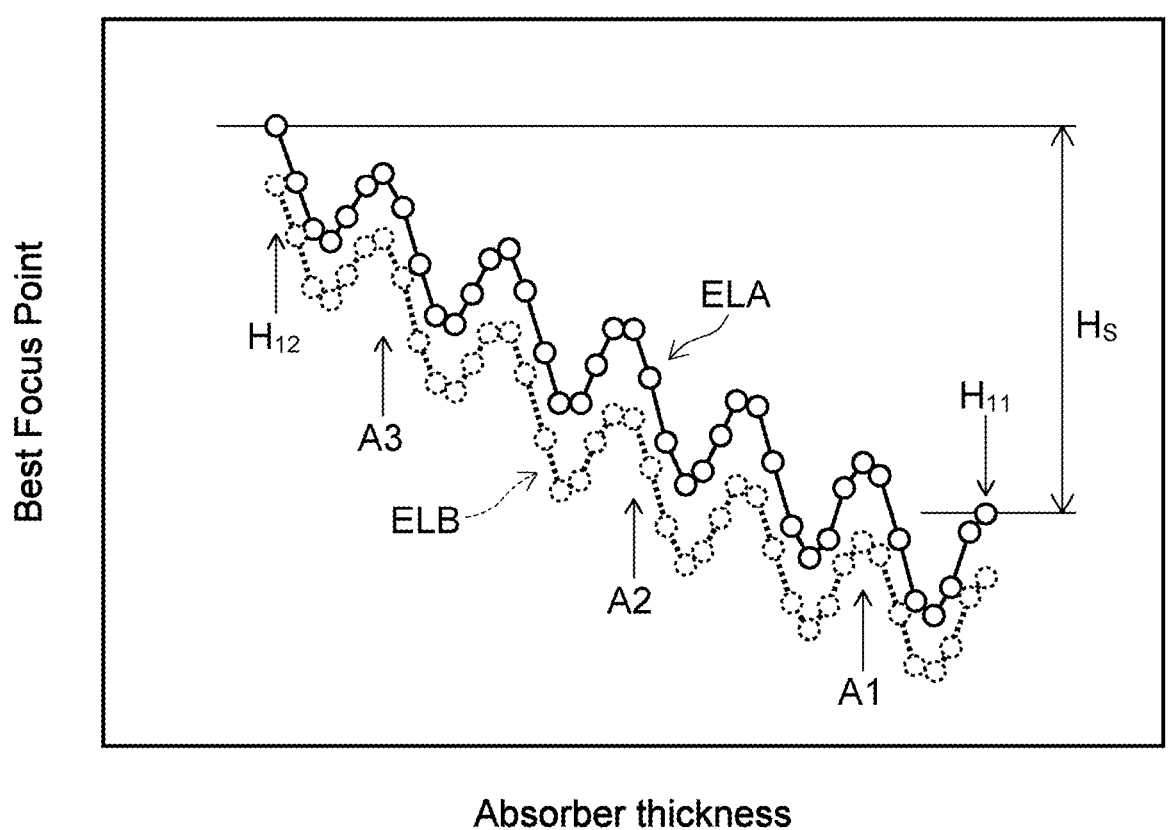
FIG. 7 is a graph illustrating a fourth characteristic of a reflection type exposure mask according to some embodiments.

FIG. 7 illustrates the best focus position of exposure light EL reflected by the reflection type exposure mask in accordance with the thickness of the absorber.

A graph ELA illustrated in FIG. 7 indicates a change of the best focus position in a case where irradiation with exposure light EL is performed in a direction which is orthogonal to the extension direction of the absorber (see FIG. 2A). A graph ELB illustrated in FIG. 7 indicates a change of the best focus position in a case where irradiation with exposure light EL is performed in a direction parallel to the extension direction of the absorber (see FIG. 2B).

As illustrated in FIG. 7, it is understood that the best focus position is shifted toward the negative side as the absorber becomes thicker, in both the graphs ELA and ELB. It is understood that the best focus position is shifted toward the negative side with fluctuation having predetermined regularity.

As described above, the best focus position is shifted toward the negative side in accordance with an increase of the thickness of the absorber. Therefore, in the example illustrated in FIG. 1, since the thickness $H_1$ of the absorber 23 is set to be thicker than the thickness $H_2$ of the absorber 25, it is possible to compensate for a difference (see FIG. 4) in the best focus position, which occurs by a difference in the extension direction. That is, it is possible to form an image of the entirety of the pattern of the light absorption layer 20 which includes the absorbers 23 and 25 having different extension directions, at the best focus position.

Figure 8:
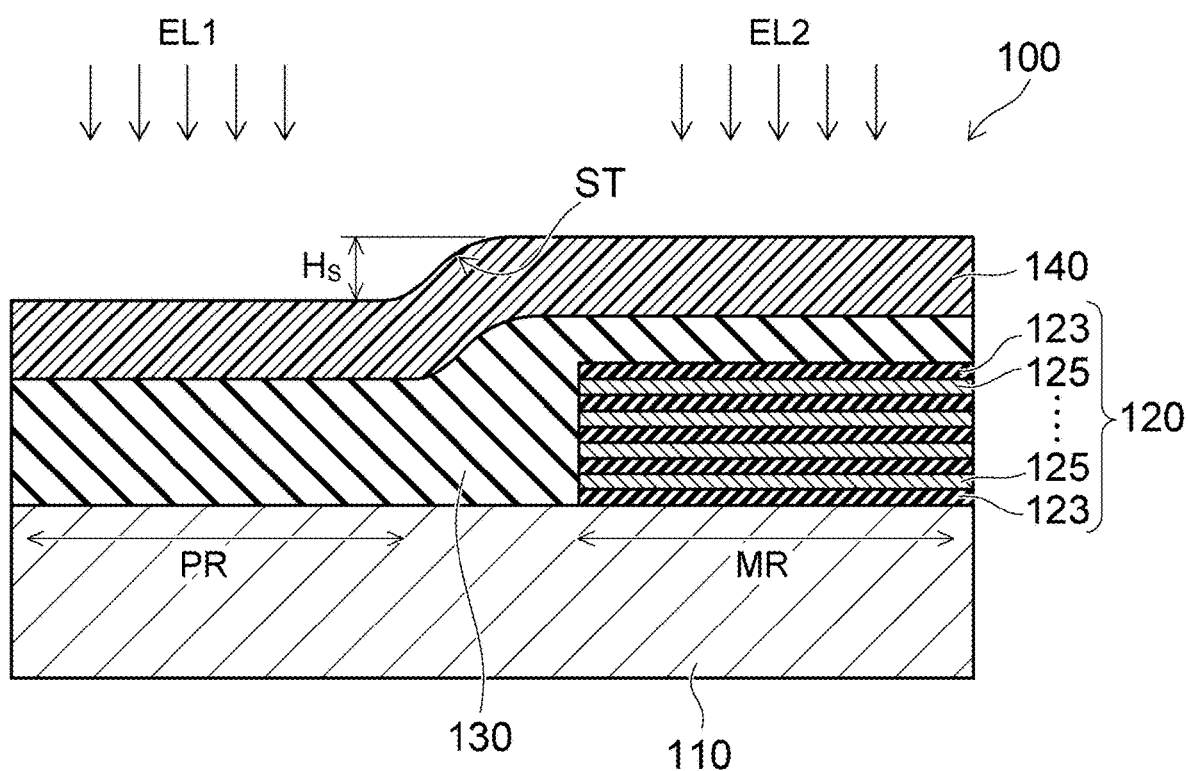
FIG. 8 is a schematic sectional view illustrating a semiconductor wafer according to some embodiments.

FIG. 8 is a schematic sectional view illustrating a semiconductor wafer 100 according to the embodiment. For example, the semiconductor wafer 100 includes a substrate 110 and a stacked body 120. For example, the semiconductor wafer 100 includes a memory cell region MR and a peripheral region PR. The stacked body 120 is provided in the memory cell region MR. The stacked body 120 includes a plurality of memory cells which are three-dimensionally arranged. The stacked body 120 has, for example, a structure in which an interlayer insulating film 123 and an electrode film 125 are alternately stacked.

The semiconductor wafer 100 further includes an insulating film 130 and a photosensitive film 140. The insulating film 130 covers both the memory cell region MR and the peripheral region PR. For example, the insulating film 130 is a thick silicon oxide film. The insulating film 130 is provided at a boundary between the memory cell region MR and the peripheral region PR, in order to reduce the step ST which is formed by the stacked body 120. For example, the photosensitive film 140 is formed of photoresist. The photosensitive film 140 is provided in order to transfer the mask pattern of the reflection type exposure mask by EUV exposure.

As illustrated in FIG. 8, the photosensitive film 140 has a step ST on the surface thereof. In EUV exposure, exposure light EL1 is condensed on the peripheral region PR and exposure light EL2 is condensed on the memory cell region MR.

Figure 9A:
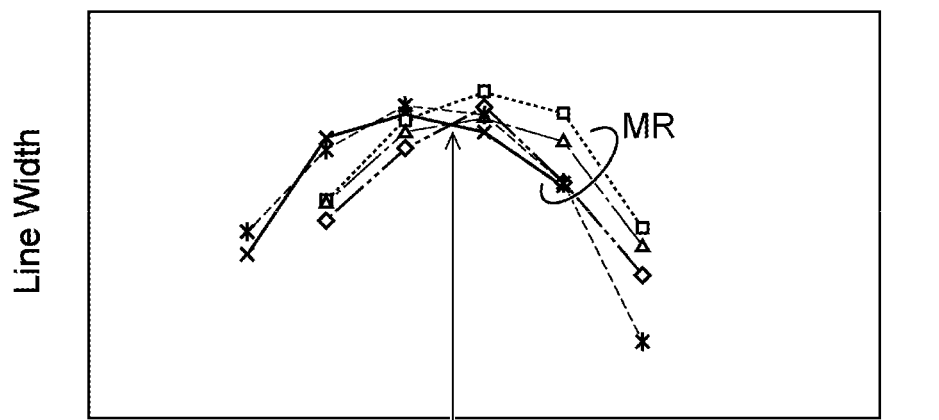
FIGS. 9A and 9B are graphs illustrating a fifth characteristic of a reflection type exposure mask according to some embodiments.
Figure 9B:
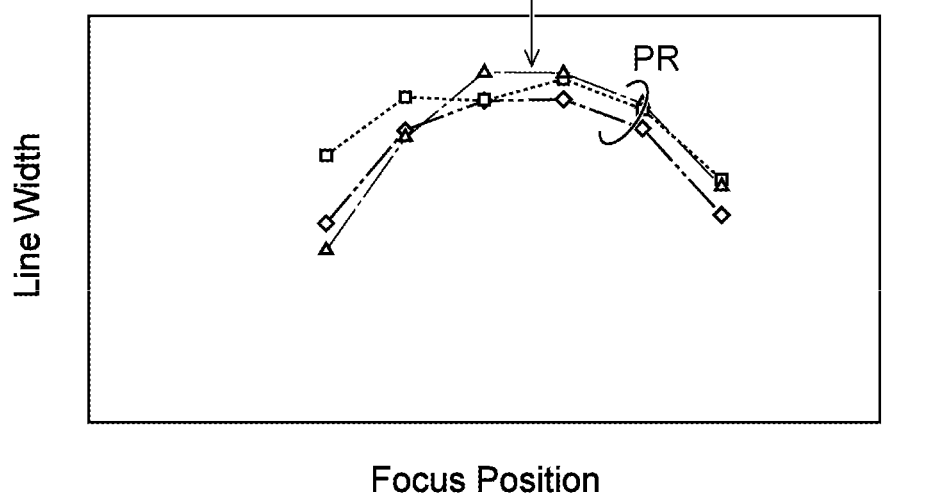

FIGS. 9A and 9B are graphs illustrating a relationship between the average line width and the focus position when a line-and-space pattern is transferred to the peripheral region PR and the memory cell region MR. The reflection type exposure mask used in this exposure includes the light absorption layer 20 in which a plurality of absorbers which extend in the Y-direction are arranged in the X-direction (see FIG. 1). Irradiation with exposure light EL is performed in a direction which is orthogonal to an extension direction of the absorber 23. (see FIG. 2A)

FIG. 9 illustrates data indicating a relationship between the average line width and the focus position in the memory cell region MR, and data indicating a relationship between the average line width and the focus position in the peripheral region PR.

As illustrated in FIG. 9, the best focus position $BF_M$ in the memory cell region MR is provided at a position which is different from the best focus position $BF_p$ in the peripheral region PR. The best focus position $BF_M$ for the memory cell region MR is located on the negative side of the best focus position $BF_p$ for the peripheral region PR. A difference between both the best focus positions occurs by the height $H_s$ of the step ST of the photosensitive film 140.

Figure 10A:
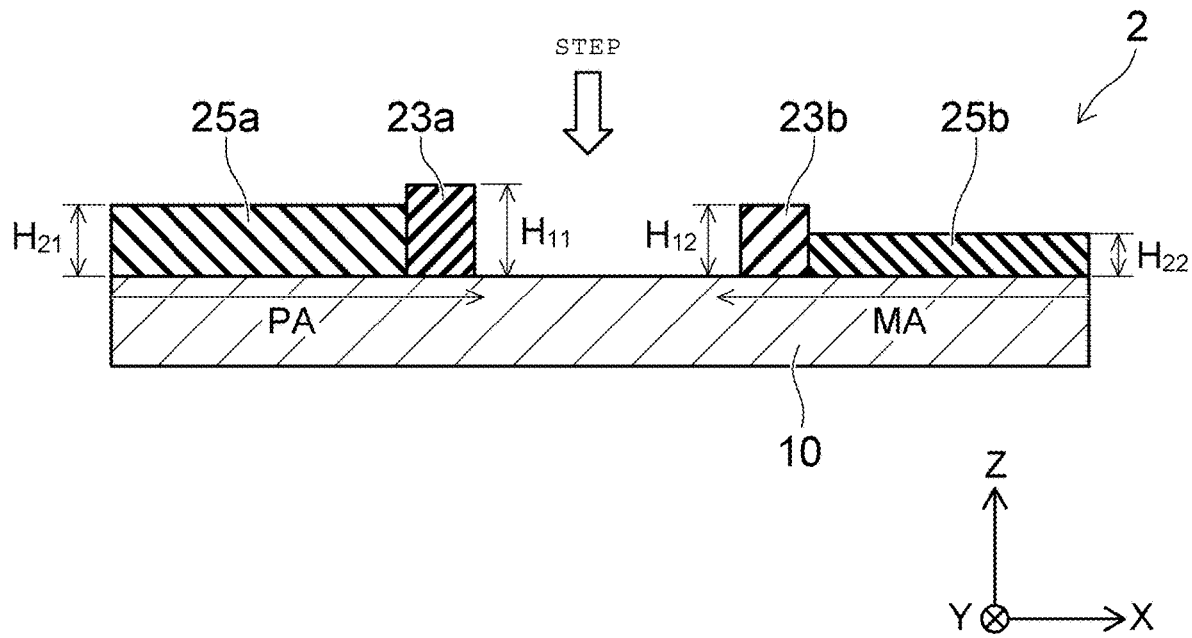
FIGS. 10A and 10B are schematic sectional views illustrating a reflection type exposure mask according to a modification example of some embodiments.
Figure 10B:
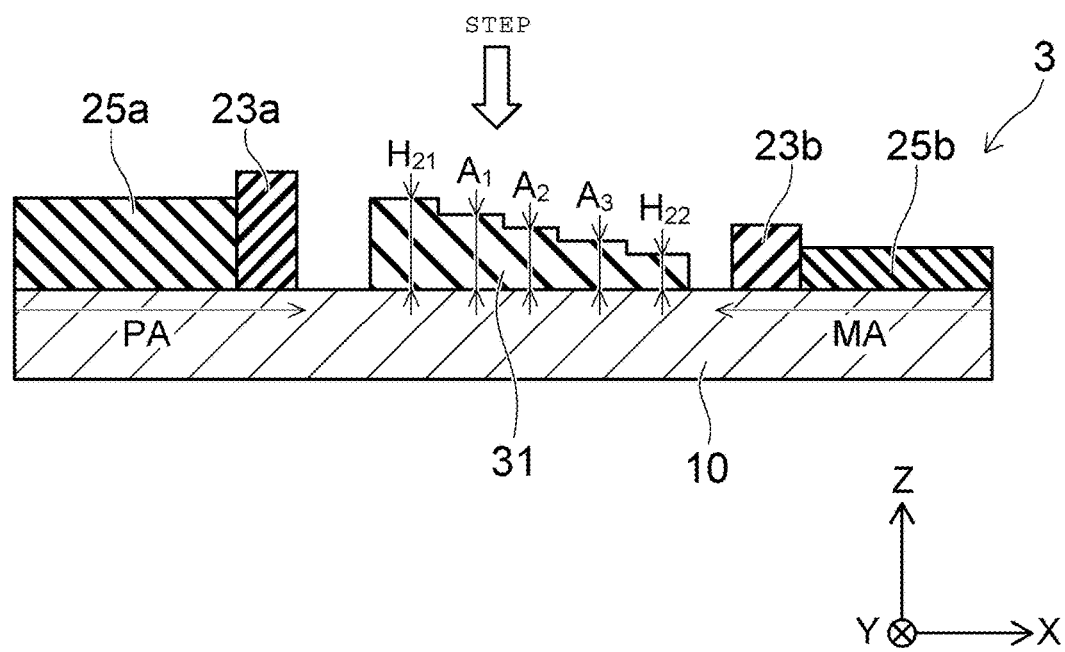

FIGS. 10A and 10B are schematic sectional views illustrating reflection type exposure masks 2 and 3 according to a modification example of some embodiments. For convenience, in FIGS. 10A and 10B, the the substrate 5 is not illustrated.

As illustrated in FIG. 10A, the reflection type exposure mask 2 includes absorbers 23a, 25a, 23b, and 25b which are provided on the reflective layer 10. The absorbers 23a and 23b extend in the Y-direction, and the absorbers 25a and 25b extend in the X-direction.

The absorbers 23a and 25a are disposed in a region PA of the reflective layer 10. The absorbers 23b and 25b are disposed in a region MA of the reflective layer 10. For example, exposure light EL reflected by the region PA is condensed on the peripheral region PR of the semiconductor wafer 100, as the exposure light EL1 (see FIG. 9). Exposure light EL reflected by the region MA is condensed on the memory cell region MR of the semiconductor wafer 100, as the exposure light EL2 (see FIG. 9). Further, exposure light EL reflected by a region between the region PA and the region MA is condensed on a portion at which the step ST of the photosensitive film 140 is provided.

As illustrated in FIG. 10A, the absorber 23a has a thickness $H_{11}$ in the Z-direction. The absorber 23b has a thickness $H_{12}$ in the Z-direction. As illustrated in FIG. 7, a difference between the best focus position at the thickness $H_{11}$ and the best focus position at the thickness $H_{12}$ corresponds to the height $H_s$ of the step ST. That is, if the absorber 23b is provided to be thinner than the absorber 23a, the best focus position of the pattern, which corresponds to the absorber 23b is shifted toward the positive side, and thus it is possible to cancel the step ST of the photosensitive film 140. In other words, if the absorber 23a is provided to be thicker than the absorber 23b, the best focus position of the pattern, which corresponds to the absorber 23a is shifted toward the negative side, and thus it is possible to cancel the step ST of the photosensitive film 140.

Similarly, the thickness $H_{21}$ of the absorber 25a in the Z-direction is provided to be thicker than the thickness $H_{22}$ of the absorber 25b in the Z-direction. Thus, it is possible to cancel the step ST of the photosensitive film 140, and to form an image of the entirety of the mask pattern of a light absorption layer which includes the absorbers 23a, 23b, 25a, and 25b at the best focus point.

The reflection type exposure mask 3 illustrated in FIG. 10(b) further includes an absorber 31. The absorber 31 is provided on a region in which exposure light to be condensed on the step portion of the photosensitive film 140 is reflected. The absorber 31 is provided to extend, for example, in a direction which intersects with the step ST of the photosensitive film 140. The absorber 31 is provided to cause the thickness in the Z-direction to be gradually changed between an end portion close to the region PA and an end portion close to the region MA. Thus, it is possible to perform exposure of a pattern corresponding to the step portion of the photosensitive film 140, at the best focus position. That is, in the pattern corresponding to the absorber 31, the best focus position changes along the step ST of the photosensitive film 140. Thus, it is possible to form an image of the entirety of the pattern, which includes a portion corresponding to the step ST, at the best focus position. The absorber 31 is effective, for example, in a case where the step ST of the photosensitive film 140 is relatively gentle.

As illustrated in FIG. 10B, the absorber 31 may be provided to have a step-like shape, for example. The end portion close to the region PA has a thickness $H_{21}$ in the Z-direction, for example. The end portion close to the region MA has, for example, a thickness $H_{22}$ in the Z-direction, which is thinner than the thickness $H_{21}$. A portion between the end portion close to the region PA and the end portion close to the region MA is provided to have plural steps including steps having thicknesses $A_1, A_2,$ and $A_3$ (see FIG. 7), for example.

Figure 11A:
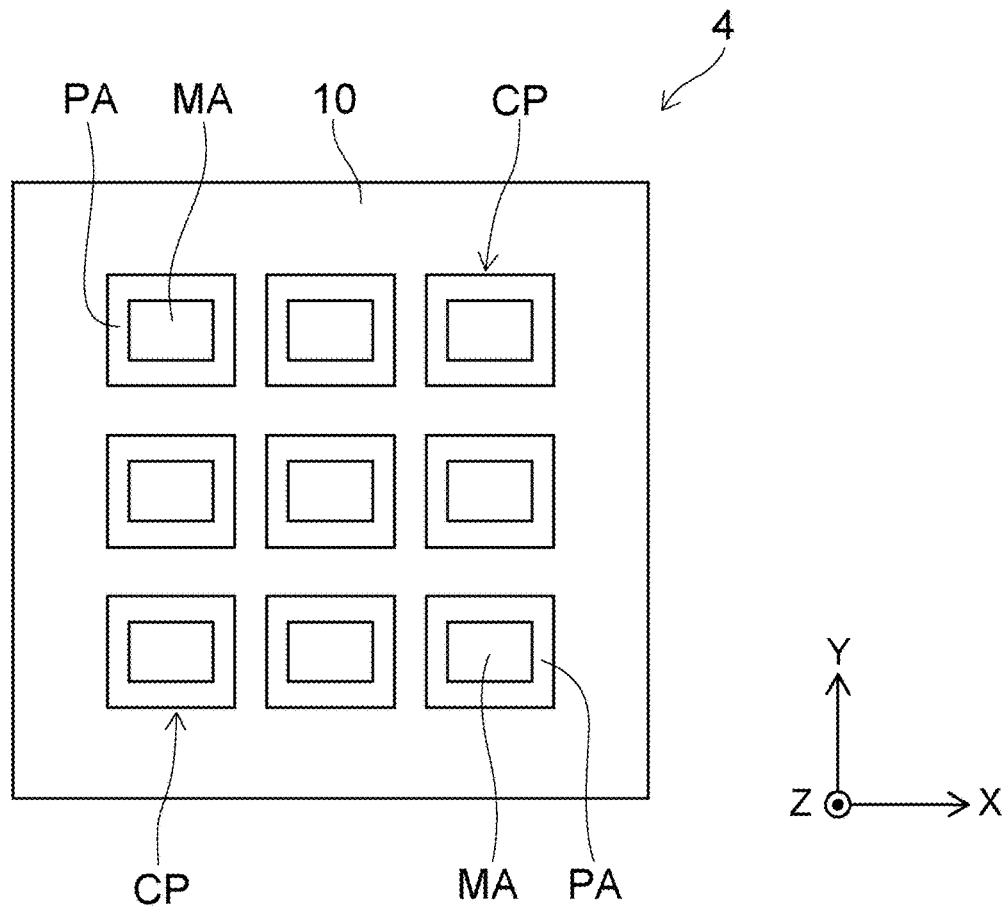
FIGS. 11A and 11B are schematic diagrams illustrating a reflection type exposure mask according to another modification example of some embodiments.
Figure 11B:
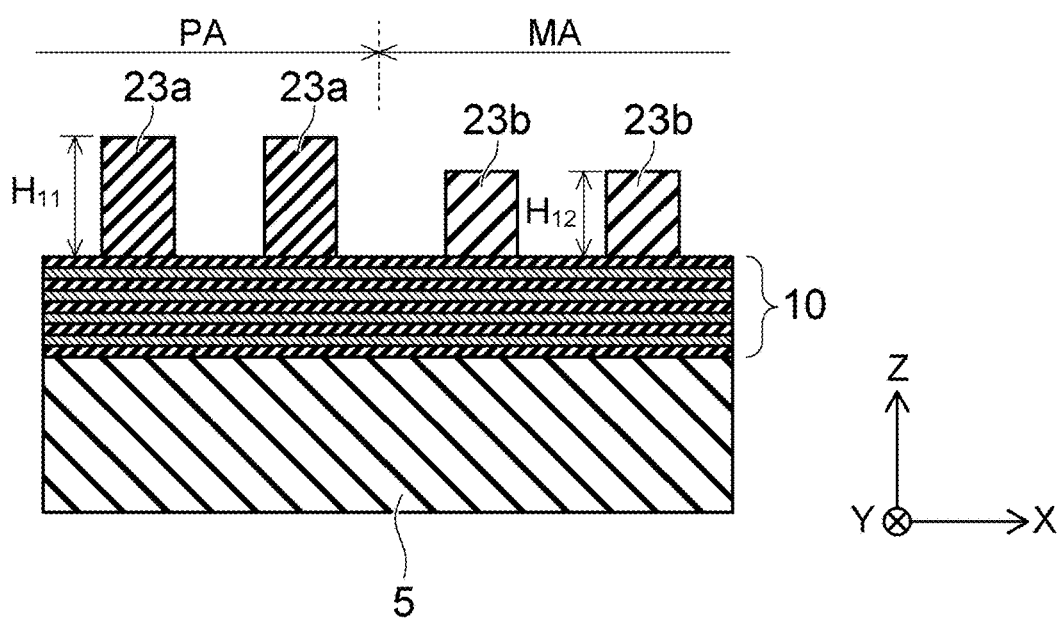

FIGS. 11A and 11B are schematic diagrams illustrating a reflection type exposure mask 4 according to another modification example of some embodiments. FIG. 11A is a plan view illustrating a reflection surface of the reflection type exposure mask 4. FIG. 11B is a partial sectional view illustrating the reflection type exposure mask 4 taken along the X-Z plane.

As illustrated in FIG. 11A, a plurality of chip patterns CP are provided on a reflective layer 10 in the reflection type exposure mask 4. The chip patterns CP are arranged at a constant interval in the X-direction and the Y-direction. Each of the chip patterns CP includes a plurality of absorbers which extend in the X-direction and the Y-direction.

Each of the chip patterns CP includes a region PA and a region MA. The region PA is provided to surround the region MA. Exposure light EL to be condensed on the memory cell region MR on a semiconductor wafer is reflected by the region MA. Exposure light EL to be condensed on the peripheral region MR is reflected by the region PA.

As illustrated in FIG. 11B, the region PA includes an absorber 23a which extends in the Y-direction, and the region MA includes an absorber 23b which extends in the Y-direction. The absorber 23a has a thickness $H_{11}$ in the Z-direction, and the absorber 23b has a thickness $H_{12}$ in the Z-direction. The thickness $H_{11}$ of the absorber 23a is provided so as to be thicker than the thickness $H_{12}$ of the absorber 23b. Thus, it is possible to cancel the step ST (see FIG. 8) of the photosensitive film 140, which is formed by a step between the memory cell region MR and the peripheral region PR, and to form an image of the entirety of the chip pattern CP at the best focus position.

Figure 12:
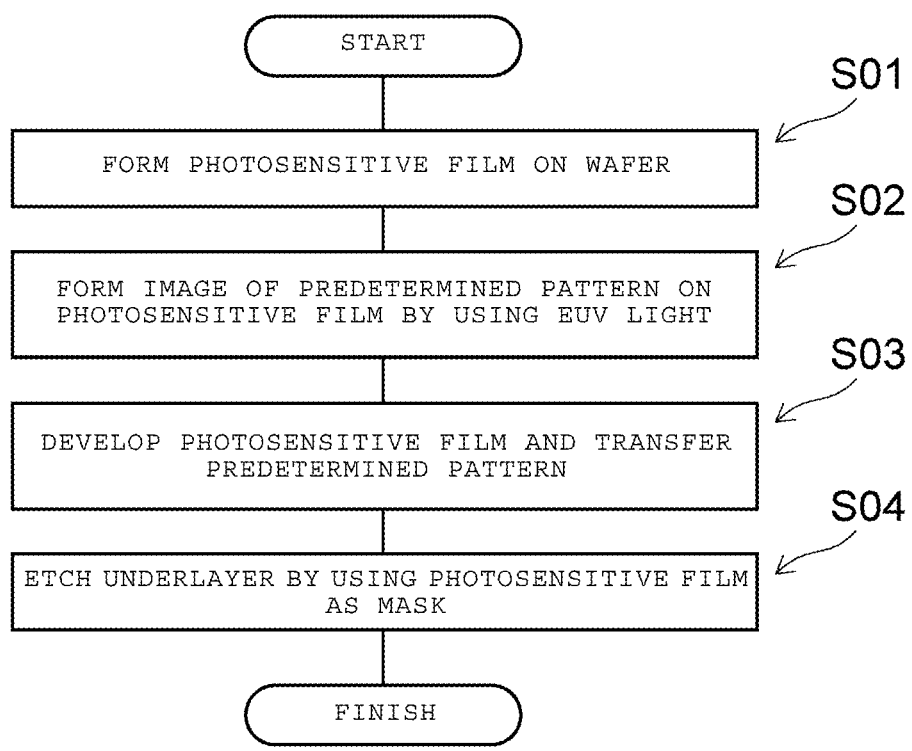
FIG. 12 is a flowchart illustrating a pattern forming method according to some embodiments.
Figure 13A:
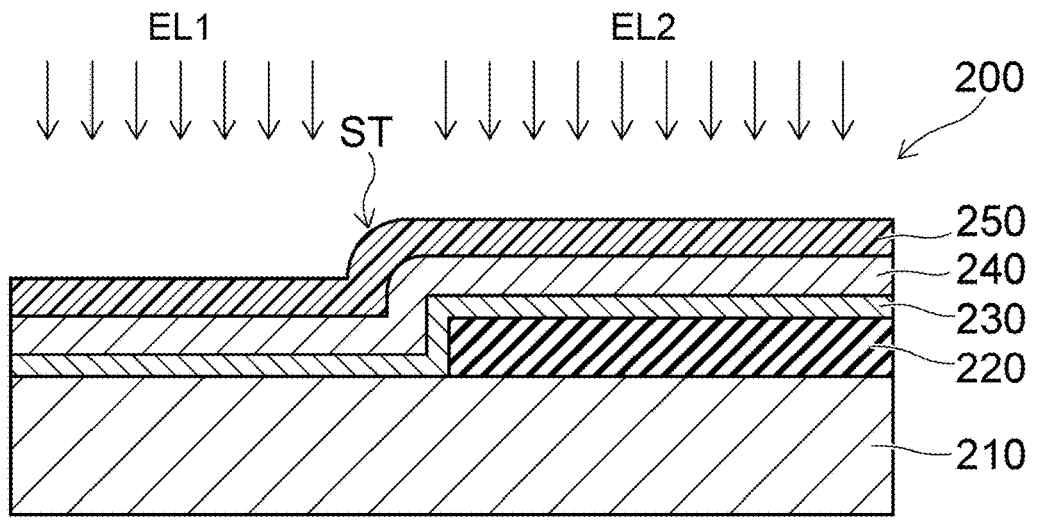
FIGS. 13A to 13C are schematic sectional views illustrating a pattern forming method according to some embodiments.
Figure 13B:
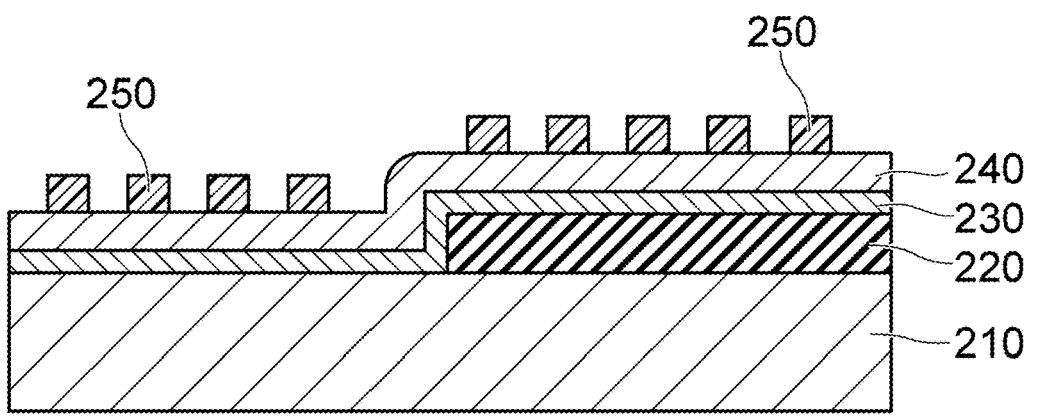
Figure 13C:
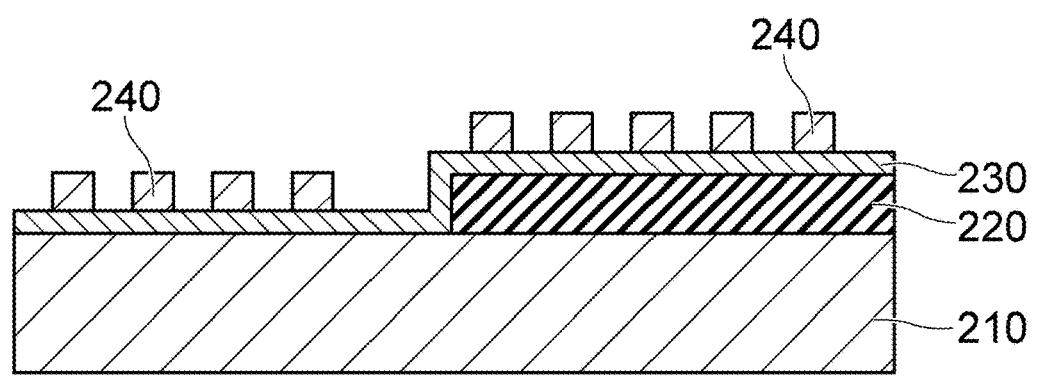

Next, a pattern forming method according to the embodiment will be described with reference to FIG. 12 and FIGS. 13A to 13C. FIG. 12 is a flowchart illustrating the pattern forming method. FIGS. 13A to 13C are schematic sectional views illustrating pattern forming procedures.

Step S01: Form a photosensitive film 250 on a semiconductor wafer 200. As illustrated in FIG. 13A, the semiconductor wafer 200 includes a substrate 210 and a structure body 220. The structure body 220 is selectively provided on the substrate 210. The semiconductor wafer 200 further may include a metal film 230 which is formed so as to cover the surface of the substrate 210 and the structure body 220. In this example, a carbon film 240 is formed so as to cover the metal film 230, and then the photosensitive film 250 is formed on the carbon film 240. The photosensitive film 250 may be formed of a positive-type photoresist, for example.

Step S02: Form an image of a predetermined pattern on the photosensitive film 250 and perform exposure. For example, exposure light EL2 is condensed on a region in which the structure body 220 is provided, and exposure light EL1 is condensed on other regions. Exposure of the photosensitive film 250 is performed, for example, by EUV exposure using a reflection type exposure mask 2. The exposure light EL1 is EUV light reflected by a region PA of the reflection type exposure mask 2. The exposure light EL2 is EUV light reflected by a region MA thereof.

As described above, the reflection type exposure mask 2 includes the absorbers 23a, 23b, 25a, and 25b. Thus, the step ST of the photosensitive film 250 is canceled, and an image of a mask pattern at the best focus position is formed across the entirety of the surface of the photosensitive film 250.

Step S03: Develop the photosensitive film 250 and transfer the mask pattern. The photosensitive film 250 is developed by using a predetermined liquid developer, and thus, for example, portions which are irradiated with the exposure light EL1 and the exposure light EL2 are selectively removed. As a result, as illustrated in FIG. 13B, a portion corresponding to a dark portion at which EUV light is absorbed by the absorbers 23a, 23b, 25a, and 25b remains on the carbon film 240.

Step S04: Etch a under a layer by using the photosensitive film 250 as a mask. As illustrated in FIG. 13C, the carbon film 240 is selectively removed by using the remaining portion of the photosensitive film 250 as a mask. The carbon film 240 may be removed, for example, by dry etching. Then, the metal film 230 is selectively removed by using the carbon film 240 which remains on the metal film 230, as a mask, thereby, for example, metal wiring is formed on the substrate 210 and the structure body 220.

The embodiments are not limited to the above examples. For example, the reflection type exposure mask 3 in which the absorber 31 is provided may be used in a region of the reflection type exposure mask, which corresponds to the step portion of the photosensitive film.

According to some embodiments, it is possible to cancel the step of the photosensitive film, which is formed by the step of the under layer, and to transfer the mask pattern at the best focus position across the entirety of the photosensitive film. Accordingly, it is possible to avoid collapse of a structure body on a wafer, which occurs by poor exposure or to avoid working poorness occurring by an unresolved mask pattern.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method comprising:
   forming a photosensitive film on a substrate, wherein the substrate includes a first region, a second region, and a third region provided between the first and second regions to cause a step to be formed on a surface of the photosensitive film prior to forming an image of a predetermined pattern on the photosensitive film;
   forming the image of the predetermined pattern on the photosensitive film by condensing reflected light of exposure light with which a reflection type exposure mask is irradiated; and
   transferring the pattern to the photosensitive film,
   wherein
   the reflection type exposure mask comprises:
      a reflective layer that reflects the exposure light, and
      a light absorption layer that is provided on a surface of the reflective layer and absorbs the exposure light,
   the light absorption layer comprises:
      a first light absorption portion which extends in a first direction along the surface of the reflective layer and causes a first image to be formed in the first region, and
      a second light absorption portion which extends in the first direction and causes a second image to be formed in the second region, and
   a thickness of the first light absorption portion in a direction which is perpendicular to the surface of the reflective layer is thinner than a thickness of the second light absorption portion in the direction which is perpendicular to the surface of the reflective layer.

2. The pattern forming method according to claim 1, wherein a difference between the thickness of the first light absorption portion and the thickness of the second light absorption portion is based on a height of the step.

3. The pattern forming method according to claim 2, wherein the difference between the thickness of the first light absorption portion and the thickness of the second light absorption portion is equal to a height of the step.

4. The pattern forming method according to claim 1, wherein the first image and the second image are formed at best focus positions in the photosensitive film, respectively.

5. The pattern forming method according to claim 1, wherein
   the light absorption layer further includes a third light absorption portion which causes a third image to be formed in the third region, and
   the third image is formed in a light condensing condition in which a focus position in a direction which is perpendicular to a surface of a region of the photosensitive film other than the third region gradually changes in a direction from the first region toward the second region.

6. The pattern forming method according to claim 1, wherein the light absorption layer is located between the first region and the second region,
   the light absorption layer further includes a third light absorption portion which causes a third image to be formed in the third region, the third light absorption portion having a stepped shape extending between the first light absorption portion and the second light absorption portion, the third light absorption portion having a thickest step in a portion closest to the first light absorption portion, and a thinnest step in a portion closest to the first light absorption portion.

7. The pattern forming method according to claim 6, wherein the thickest step has a same height as the first light absorption portion, and the thinnest step has a same height as the second light absorption portion.

8. A pattern forming method comprising:
   forming a photosensitive film on a substrate, wherein the substrate includes a first region, a second region, and a third region provided between the first and second regions to cause a step to be formed on a surface of the photosensitive film prior to forming an image of a predetermined pattern on the photosensitive film;
   forming the image of the predetermined pattern on the photosensitive film by condensing reflected light of exposure light with which a reflection type exposure mask is irradiated; and
   transferring the pattern to the photosensitive film,
   wherein
   the reflection type exposure mask comprises:
      a reflective layer that reflects the exposure light, and
      a light absorption layer that is provided on a surface of the reflective layer and absorbs the exposure light,
   the light absorption layer comprises:
      a first light absorption portion which extends in a first direction along the surface of the reflective layer and causes a first image to be formed in the first region, and
      a second light absorption portion which extends in a second direction, which intersects with the first direction, and causes a second image to be formed in the second region, and
   a thickness of the first light absorption portion in a direction which is perpendicular to the surface of the reflective layer is different than a thickness of the second light absorption portion in the direction which is perpendicular to the surface of the reflective layer.

9. The pattern forming method according to claim 8,
wherein the difference between the thickness of the first light absorption portion and the thickness of the second light absorption portion is based on, from a top view, the relative direction of exposure light incident on the mask and the first direction and the relative direction of exposure light incident on the mask and the second direction.

10. The pattern forming method according to claim 9,
wherein, from a top view, the direction of exposure light incident on the mask is perpendicular to the first direction and the direction of exposure light incident on the mask is parallel to the second direction.

\* \* \* \* \*